United States Patent [19]
McGowan

[11] Patent Number: 5,821,776
[45] Date of Patent: Oct. 13, 1998

[54] FIELD PROGRAMMABLE GATE ARRAY WITH MASK PROGRAMMED ANALOG FUNCTION CIRCUITS

[75] Inventor: John E. McGowan, Sunnyvale, Calif.

[73] Assignee: Actel Corporation, Sunnyvale, Calif.

[21] Appl. No.: 792,902

[22] Filed: Jan. 31, 1997

[51] Int. Cl.⁶ .............................................. H03K 19/177
[52] U.S. Cl. .............................................. 326/41; 326/39
[58] Field of Search .............................. 326/37, 38, 39, 326/41

[56] References Cited

U.S. PATENT DOCUMENTS

| | | | |
|---|---|---|---|
| 4,713,792 | 12/1987 | Hartmann et al. | 364/900 |
| 5,068,603 | 11/1991 | Mahoney | 324/158 |

(List continued on next page.)

FOREIGN PATENT DOCUMENTS

| | | | |
|---|---|---|---|
| 0 499 383 | 12/1996 | European Pat. Off. | H03K 19/177 |
| 0 746 106 | 12/1996 | European Pat. Off. | H03K 19/177 |
| 0 748 051 | 12/1996 | European Pat. Off. | H03K 19/177 |
| 0 756 383 | 1/1997 | European Pat. Off. | H03K 19/177 |
| 0 759 662 | 2/1997 | European Pat. Off. | H03K 19/177 |
| 0 780 846 | 6/1997 | European Pat. Off. | G11C 5/00 |
| 0 785 630 | 7/1997 | European Pat. Off. | H03K 19/177 |
| 0 786 871 | 7/1997 | European Pat. Off. | H03K 19/173 |
| 0 790 706 | 8/1997 | European Pat. Off. | H03K 19/177 |
| 96/35263 | 11/1996 | WIPO | H03K 19/177 |
| 97/03444 | 1/1997 | WIPO | G11C 7/00 |

OTHER PUBLICATIONS

Brown, Chappell, "Data–flow Architecture Runs on FPGA", Nov. 4, 1996, EE Times, Issue 926, pp. 41–42.

Bursky Dave, "Programmable Arrays Mix FPGA and ASIC Blocks", Oct. 14, 1996, Electronic Design, pp. 69–74.

Cypress, "Getting to Grips FPGAs", Aug. 1996, Australian Electronics Engineering, pp. 46, 48.

Fawcett et al., "Reconfigurable Processing with Field Programmable Gate Arrays", 1996 IEEE, International Conference on Applications–Specific Systems, Architecture and Processors, pp. 293–302.

(List continued on next page.)

*Primary Examiner*—Jon Santamauro
*Assistant Examiner*—Don Phu Le
*Attorney, Agent, or Firm*—D'Alessandro & Ritchie

[57] ABSTRACT

A mixed signal integrated circuit architecture comprising a mask programmable portion and a field programmable gate array portion. The mask programmable portion has a plurality of mask programmed analog function circuits, and a first group of input/output pads, wherein one of the input/output pads of the first group is connected to an input of one of the analog function circuits, and one of the input/output pads of the first group is connected to an output of one of the analog function circuits. The field programmable gate array portion has programmable digital logic function modules, a second group of input/output pads, interconnect conductors divided into one or more segments, wherein some segments run in a first direction and some segments run in a second direction to form intersections and some segments form intersections with inputs and outputs of the digital logic function modules, the first group of input/output pads, and inputs and outputs of the analog function circuits from the mask programmable analog portion, and user programmable interconnect elements connected between adjoining ones of the segments in a same one of the interconnect conductors, and between intersections of selected ones the first and second segments, intersections of inputs and outputs of the digital logic function modules and selected interconnect conductors, intersections of the first group of input/output pads and selected ones of the interconnect conductors, intersections with outputs of the analog function circuits and selected ones of the interconnect conductors, and intersections with the inputs of the analog function circuits and selected ones of the interconnect conductors.

3 Claims, 5 Drawing Sheets

U.S. PATENT DOCUMENTS

| | | | |
|---|---|---|---|
| 5,107,146 | 4/1992 | El-Ayat | 362/41 |
| 5,191,242 | 3/1993 | Agrawal et al. | 326/39 |
| 5,329,181 | 7/1994 | Ridgeway | 307/465 |
| 5,493,239 | 2/1996 | Zlotnick | 326/38 |
| 5,543,730 | 8/1996 | Cliff et al. | 326/38 |
| 5,548,228 | 8/1996 | Madurawe | 326/41 |
| 5,548,552 | 8/1996 | Madurawe | 365/185.33 |
| 5,550,839 | 8/1996 | Buch et al. | 371/22.1 |
| 5,559,447 | 9/1996 | Rees | 326/30 |
| 5,559,465 | 9/1996 | Shah | 327/374 |
| 5,563,528 | 10/1996 | Diba et al. | 326/39 |
| 5,563,592 | 10/1996 | Cliff et al. | 341/63 |
| 5,568,081 | 10/1996 | Lui et al. | 327/380 |
| 5,581,198 | 12/1996 | Trimberger | 326/38 |
| 5,583,749 | 12/1996 | Tredennick et al. | 361/790 |
| 5,590,305 | 12/1996 | Terrill et al. | 395/430 |
| 5,598,108 | 1/1997 | Pedersen | 326/41 |
| 5,600,597 | 2/1997 | Kean et al. | 365/189.08 |
| 5,625,301 | 4/1997 | Plants et al. | 326/41 |
| 5,631,577 | 5/1997 | Freidin et al. | 326/40 |
| 5,633,830 | 5/1997 | Sung et al. | 365/221 |
| 5,635,851 | 6/1997 | Tavana | 326/27 |
| 5,640,106 | 6/1997 | Erickson et al. | 326/38 |
| 5,640,308 | 6/1997 | Osann, Jr. et al. | 326/777 |
| 5,642,058 | 6/1997 | Trimberger et al. | 326/41 |
| 5,642,262 | 6/1997 | Terrill et al. | 361/783 |
| 5,644,496 | 7/1997 | Agrawal et al. | 364/489 |
| 5,646,544 | 7/1997 | Iadanza | 326/38 |
| 5,650,734 | 7/1997 | Chu et al. | 326/38 |
| 5,652,529 | 7/1997 | Gould et al. | 326/93 |
| 5,652,904 | 7/1997 | Trimberger | 395/800 |
| 5,654,564 | 8/1997 | Mohsen | 257/209 |
| 5,654,649 | 8/1997 | Chua | 326/38 |
| 5,661,409 | 8/1997 | Mohsen | 324/765 |
| 5,661,685 | 8/1997 | Lee et al. | 365/185.22 |
| 5,671,234 | 9/1997 | Philips et al. | 371/22.3 |
| 5,671,432 | 9/1997 | Bertolet et al. | 395/800 |
| 5,677,691 | 10/1997 | Hosticks et al. | 326/39 |
| 5,680,061 | 10/1997 | Veenstra et al. | 326/38 |
| 5,682,106 | 10/1997 | Cox et al. | 326/39 |

OTHER PUBLICATIONS

Ristelhueber, Robert, "A Marriage of Convenience—Integration of PLDs and ASICs promises big gains, risks for chip vendors", Jan. 1997, Electronic Business Today, pp. 63–64.

Tchoumatchenko, et al., "FPGA Design Migration: Some Remarks", Sep. 23–25, 1996, 6th International Workshop on Field–Programmable Logic and Applications, FPL '96, Darmstadt, Germany, Proceedings, pp. 405–409.

Wilson, Ron, "Actel Unveils FPGA Family", Oct. 28, 1996, Electronic Engineering Times, Issue 925, pp. 88, 92.

Won, Martin S.,et al., "Building FIR Filters in Programmable Logic", Aug. 1996, Embedded Systems Programming, pp. 48–50, 52, 54, 56, 58–59.

FIELD PROGRAMMABLE GATE ARRAY WITH MASK PROGRAMMED ANALOG FUNCTION CIRCUITS

BACKGROUND OF THE INVENTION

1. Field of the Invention

The present invention relates to mixed signal integrated circuits. More particularly, the present invention relates an integrated circuit having a field programmable gate array (FPGA) portion providing digital logic functions to the integrated circuit, and a mask programmable portion providing analog functions to the integrated circuit.

2. The Prior Art

As is well known in the art, an FPGA is a collection of groups of gates partitioned into logic function modules which may be configured by user programmable interconnect elements to implement a large variety of digital logic functions. A programmable interconnect architecture, comprising a plurality of initially uncommitted interconnect conductors is superimposed over the array of logic function modules to enable custom connections to be made among the input and outputs of individual ones of logic function modules by user programmable elements to form digital circuits. The user programmable interconnect elements in both the logic function modules and the interconnect architecture may take several forms, such as one time programmable antifuse elements, transistors, RAM cells, etc. These forms of user programmable interconnect elements are well known to those of ordinary skill in the art.

The logic function modules may be any one of a variety of circuits, including, for example, the logic modules disclosed in U.S. Pat. No. 4,758,745 to El Gamal, et al., U.S. Pat. No. 4,873,459 to El Gamal, et al., U.S. Pat. No. 4,910,417 to El Gamal, et al., U.S. Pat. No. 5,015,885 to El Gamal, et al., U.S. Pat. No. 5,451,887 to El Ayat, et al., and U.S. Pat. No. 5,477,165 to El Ayat, et al., U.S. Pat. No. 5,055,718 to Galbraith, et al., U.S. Pat. No. 5,198,705 to Galbraith, et al., U.S. Pat. No. 5,440,245, to Galbraith, et al., U.S. Pat. No. 5,448,185 to Kaptanoglu, U.S. Pat. No. 5,479,113 to El Gamal, et al., U.S. Pat. No. 5,570,041 to El Ayat, et al., U.S. Pat. No. 5,610,534 to Galbraith, et. al., and U.S. Pat. No. 5,606,267 to El Ayat, et. al., assigned to the same assignee as the present invention, and expressly incorporated herein by reference.

Examples of several aspects of antifuse based FPGA architectures are disclosed in U.S. Pat. No. 4,758,745 to El Gamal, et al., U.S. Pat. No. 4,873,459 to El Gamal, et al., U.S. Pat. No. 5,073,729 to Greene, et al., U.S. Pat. No. 5,083,083 to El Ayat, et al., and U.S. Pat. No. 5,132,571 to McCollum, et al., U.S. Pat. No. 5,172,014 to El Ayat, U.S. Pat. No. 5,187,393 to El Ayat, et al., U.S. Pat. No. 5,191,241 to McCollum, et al., U.S. Pat. No. 5,317,698 to Chan, et al., U.S. Pat. No. 5,367,208 to El Ayat, et al., U.S. Pat. No. 5,451,887 to El Ayat, et al., U.S. Pat. No. 5,477,165 to El Ayat, et al., U.S. Pat. No. 5,509,128 to Chan, et al., U.S. Pat. No. 5,510,730 to El Gamal, et al., U.S. Pat. No. 5,537,056 to McCollum, U.S. Pat. No. 5,570,041 to El Ayat, et al., U.S. Pat. No. 5,606,267 to El Ayat, et. al., and U.S. Pat. No. 5,600,265 to El Gamal, et al., assigned to the same assignee as the present invention, and expressly incorporated herein by reference.

An example of a transistor-interconnect-element based FPGA architecture is disclosed in U.S. Pat. No. 4,870,302 to Freeman. Products embodying this type of architecture are marketed by Xilinx, Inc. of San Jose, Calif. In this architecture, transistors controlled by RAM cells are selectively turned on to make interconnections between logic function modules. Another such example is found in U.S. Pat. No. 5,187,393 El Gamal, et al. which uses EPROM or EEPROM transistors.

In a conventional FPGA, a wide variety of digital logic and I/O functions with many desirable characteristics may be implemented. The digital logic of an FPGA is very efficiently implemented by groups of P-channel MOS transistors and N-channel MOS transistors. The implementation of the digital logic typically takes an approach wherein a HIGH logic level is around Vcc and a LOW logic level is around ground. Often, a voltage divider approach is used wherein first and second conducting paths to Vcc and ground, respectively, are implemented as pull up and pull down paths. To ensure efficient implementation of the pull up and pull down paths, practices in the art have developed to determine the manner in which the pull up and pull down paths may be connected. In CMOS logic, the pull up paths are usually restricted to serial and parallel combinations of P-channel MOS devices, while the pull down paths are restricted to serial or parallel combinations of N-channel MOS devices.

The high efficiency of the logic modules in a FPGA is also due to the fact that although a wide variety of logic functions may be implemented, these logic functions are standard logic functions. Optimizing the use of the available logic function modules in a FPGA is a very important goal of FPGA circuit designers. The development of placement and route routines which will optimize the use of the logic modules in a FPGA is an expensive and time consuming process. It is important to avoid placing constraints on the logic function modules which may substantially affect the utilization of the logic function modules or may prevent the placement and routing algorithms from implementing certain desired digital logic functions.

It is further well known in the art that due to the large voltage swings from ground to Vcc in digital functions, the circuits implementing digital functions are relatively insensitive to process variations in voltage sensitive parameters.

With the advent of sophisticated electronic systems, wherein both analog and digital functions are used, it has become known and desired in the art to have both digital and analog signal systems on the same integrated circuit die. For example, in an FPGA, digital signal processing (DSP) techniques have to implement analog functions with logic functions modules. An example of such an implementation is found in U.S. Pat. No. 5,457,644, to McCollum et al. Though in some situations the use of DSP techniques to implement analog functions in a FPGA is a valuable architecture, there are also instances where it may not be a desired architecture.

One of the problems faced by the designers of FPGA architectures is in deciding the amount of complexity to be given to each of the digital circuits in a particular logic function module. To those of ordinary skill in the art, this amount of complexity is known as granularity, that is, the amount of functionality available from the smallest discretely programmable unit or logic module. In an FPGA of "coarse" granularity, wherein the number of logic modules is few and the functionality of each logic function module is relatively complex, there may be little difficulty implementing a single complex analog function in a single function module. In contrast, in FPGAs of "medium" or "fine" granularity, the implementation of even a simple analog function may require several logic function modules. This of course requires that some of the programmable interconnect resources must be employed to interconnect the various logic function modules used to implement the analog function. As the complexity of the analog function increases, so does the number of logic function modules required to implement the analog function. The DSP implementation of analog functions along with the implementation of digital functions by logic function modules, impacts both the placement and routing of the overall FPGA design, and diminishes performance.

In analog circuits, it is sometimes necessary to use passive components such as capacitors and resistors. To implement capacitors and resistors as part of a DSP design in a FPGA can be problematic. It is difficult to program the connections between the logic function modules to obtain the exact values for resistors and capacitors. It can also consume a great deal of logic module resources, and therefore, may be very inefficient.

There are also mixed signal systems wherein both analog and digital functions which are programmable as modules are implemented on the same integrated circuit die. A problem with single integrated circuits wherein both the digital circuits and the analog circuits are programmable, is that to obtain acceptable desensitization in the analog programmable circuits to parameters such as voltage swing, the transistors in the analog circuits must be made much larger that the minimum required. As a result of the increase in transistor size, the digital circuits are subjected to unnecessary propagation delay and insufficient current drive. A further problem is that the analog programmable circuits are subject to the noise generated by the switching of the digital programmable circuits.

There are also mixed signal systems wherein both the digital circuits and analog circuits are both mask programmed. The flexibility of such integrated circuits is clearly limited, in that all of the connections to the circuit are set at the time that the circuit is fabricated. The circuits offer very little to the user that requires the flexibility of a FPGA circuit architecture.

It is therefore an object of the present invention to provide a mixed signal integrated circuit, wherein the digital circuits have the flexibility found in a FPGA.

It is another object of the present invention, to provide a mixed signal integrated circuit wherein the process desensitization in the analog circuits does not result in excessive propagation delay or insufficient current drive in the digital circuits.

It is yet another object of the present invention to provide a mixed signal integrated circuit wherein there is an efficient use of the programmable resources in the integrated circuit.

It is another object of the present invention to provide a mixed signal integrated circuit wherein a first portion of the integrated circuit is an FPGA of digital circuits, and wherein a second portion of the integrated circuit is mask programmed analog circuits.

It is a further object of the present invention to provide a mixed signal integrated circuit wherein the analog functions on the integrated circuit are implemented efficiently and with as few integrated circuit resources as needed.

It is yet another object of the present invention to provide a mixed signal integrated circuit wherein the level of noise in the integrated circuit is substantially controlled.

It is yet another object of the present invention to provide a mixed signal integrated circuit wherein a wide range of topologies may be implemented for the analog functions which are different from the topologies for the digital circuits.

BRIEF DESCRIPTION OF THE INVENTION

According to the present invention, a mixed signal integrated circuit comprises a FPGA portion for digital circuits, and a mask programmable portion for analog circuits. The FPGA portion has programmable logic modules which are selectively connectable to one another and to I/O buffers by an interconnect architecture formed by a first plurality of interconnect conductors. The mask programmable portion is connectable to the interconnect architecture of the FPGA portion by a second plurality of interconnect conductors which span the mask programmable and FPGA portions of the mixed signal portions of the integrated circuit.

In one aspect of the present invention, the FPGA portion of the mixed signal integrated circuit is optimized to implement digital logic functions and to provide a high degree of utilization of the logic modules by the digital circuits.

In another aspect of the present invention, the mask programmable portion of the mixed signal integrated circuit can implement a wide variety of analog circuit topologies using a minimum of the resources of the integrated circuit.

In another aspect of the present invention, the analog circuits in the mask programmable portion may be isolated from the FPGA portion by separate power busses to substantially reduce the level of noise to the analog circuits in the mixed signal system. Further, the analog circuits can be segregated to certain power bus portions which are isolated from one another. The mask programming layer can be used to substitute power pads for certain I/O locations, and thereby provide selected analog circuits separate busses to I/O pins. For analog circuits which are extremely noise sensitive, the bus in the masked programmable portion can be tailored to be wider and thereby obtain lower ohmic voltage drops. For an analog circuit implemented as a high power driver a thicker busing structure may be employed to increase electromigration immunity.

In another aspect of the present invention, the FPGA portion of the mixed signal integrated circuit may be employed to provide digital signals to the mask programmable portion of the mixed signal integrated circuit, and the mask programmable portion of the mixed signal integrated circuit may be employed to provide digital signals to the FPGA portion of the mixed signal integrated circuit.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

According to the present invention, a mixed signal integrated circuit has a FPGA portion for digital circuits, and a mask programmable portion for analog circuits. By separating the digital circuits and analog circuits into a FPGA portion and a mask programmable portion, respectively, a substantial number of advantages are realized in the mixed signal system. A great advantage is the retention of the optimization presently found in the art for digital circuits in an FPGA. The digital circuits can be implemented by parallel and serial combinations of P-channel and N-channel MOS transistors in a very efficient manner as is known in the art. Further, the size of the function module in the FPGA can be optimized so that there is a high degree of utilization of the logic modules by the digital circuits.

On the analog side in the mask programmable portion, the analog circuit functions can be implemented using a minimum of the resources of the integrated circuit. The analog circuit functions may also be implemented simply and with a variety of topologies. Further, the analog circuit functions can be separated by power buses from the noise found in the digital portion of the integrated circuit. In CMOS technology, the mask programmable portion comprises N-channel and P-channel MOS transistors that can be connected together to implement almost any type of analog circuit conceivable in CMOS technology. It should be appreciated that technologies other than CMOS are available for implementing the mask programmable portion of the present invention.

It should be further appreciated that the inputs and outputs of the analog circuits in the mask programmable portion of the integrated circuit to be described herein may be provided to a single I/O pin or several I/O pins. The choice of the analog circuits to be included in the masked programmable portion will depend upon the needs of the end user of the integrated circuit. Accordingly, a variety of integrated circuits, each having a different mask programmable portion and a general FPGA portion are contemplated by the present invention.

Figure 1:
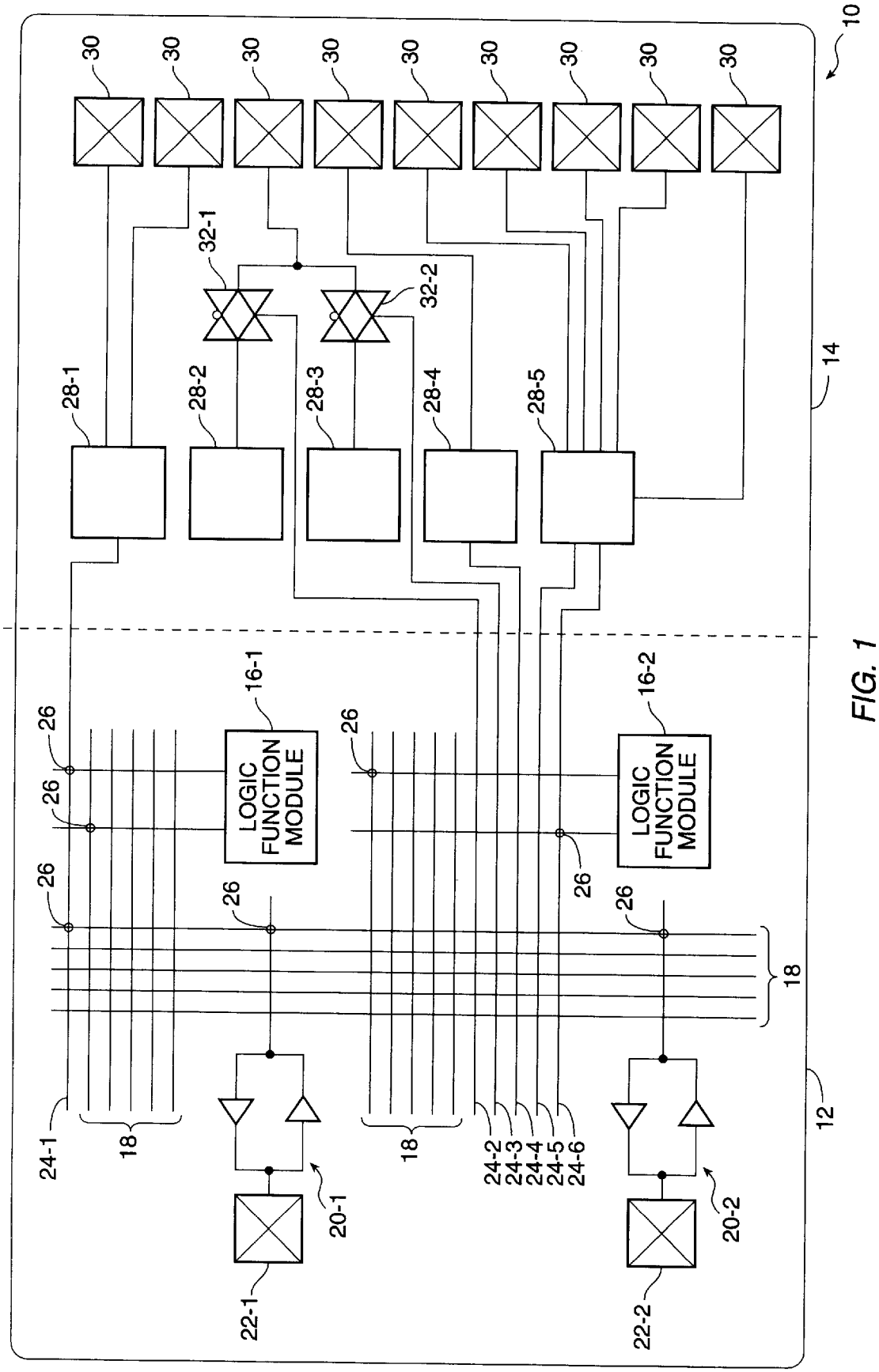
FIG. 1 is a block diagram illustrating a mixed signal integrated circuit having an FPGA portion to implement digital logic functions and mask programmable portion to implement analog functions according to the present invention.

Turning now to FIG. 1, a block diagram depicts the mixed signal FPGA and mask programmable architecture according to the present invention. In FIG. 1, an integrated circuit die 10 is partitioned into an FPGA portion 12 and a mask programmable portion 14. It should be appreciated, however, that the present invention is not limited by the particular physical layout of the partitioning of the FPGA portion 12 and the mask programmable portion 14 shown in the FIG. 1. In the FPGA portion 12, exemplary logic modules 16-1 and 16-2 are connected to an interconnect structure comprising general interconnect conductors 18 by user programmable interconnect elements 26. Though not specifically illustrated, the user programmable interconnect elements 26 may fully populate all of the intersections between logic function modules 16-1 and 16-2 and the interconnect conductors 18 or only a selected group of intersections. The user programmable interconnect elements 26 may take several forms, such as a one time programmable antifuse element, transistors, RAM cells, etc. These forms of user programmable interconnect elements are well known to those of ordinary skill in the art.

The general interconnect conductors 18 represent a wide variety of interconnection schemes for connecting logic modules in a FPGA. The present invention is not limited to any specific interconnect architecture employed in FPGA. To avoid overcomplicating the disclosure and obscuring the present invention, the various interconnection schemes available for interconnecting logic modules and FPGA will not be disclosed herein. Numerous examples of interconnection schemes which are suitable for use in conjunction with the present invention are well known to those of ordinary skill in the art. Different interconnect architectures including segmented interconnect architectures are well known to those of ordinary in the art, and a non-exhaustive list of such interconnect schemes is represented by the interconnect schemes referred to the above discussed prior art section.

Further, there are numerous known logic function module designs which are available to be employed in the present invention period. The present invention is not limited to any specific logic module design employed in FPGA. To avoid overcomplicating the disclosure and obscuring the present invention, the various logic function module designs available for use in a FPGA will not be disclosed herein. A non-exhaustive list of such logic modules is represented by the logic modules referred to the above discussed prior art section. Those of ordinary skill in the art will appreciate the particular logic module selected for an actual realization of the present invention will be largely a matter of design choice.

Disposed in the FPGA portion 12 are I/O buffers 20-1 and 20-2 connected to I/O pins 22-1 and 22-2 respectively. The I/O buffers 20-1 and 20-2 are simplified depictions of input and output buffers which may provide any of the I/O functions known in FPGA technology. In the FPGA portion 12, I/O buffers 20-1 and 20-2 are connected to interconnect conductors 18 by user programmable interconnect elements 26. Though not specifically illustrated, the user programmable interconnect elements 26 may fully populate all of the intersections between I/O buffers 20-1 and 20-2 and the interconnect conductors 18 or only a selected group of intersections.

An exemplary input and output scheme suitable for use in the present invention is found in application Ser. No. 08/444, 243, filed Apr. 18, 1995, now U.S. Pat. No. 5,625,301, and assigned to the assignee of the present invention and specifically incorporated herein by reference. Further, although not specifically illustrated in FIG. 1, one or more of the input and output buffer functions in the integrated circuit 10 may be mask programmed in the mask programmable portion 14 in the integrated circuit 10 as disclosed in co-pending application Ser. No. 08/792,482, filed Jan. 1, 1997, and assigned to the assignee of the present invention and specifically incorporated herein by reference.

In the integrated circuit 10, interconnect conductors 24-1 through 24-6 span both the FPGA portion 12 and the mask programmable portion 14 of the integrated circuit die 10.

Interconnect conductors 24-1 through 24-6 are employed to connect the FPGA portion 12 to the analog circuits formed in the mask programmable portion 14. In the FPGA portion 12, the interconnect conductors 24-1 through 24-6 form intersections with the interconnect architecture represented by interconnect conductors 18.

Disposed at a number of the intersections between interconnect conductors 24-1 through 24-6 and the interconnect architecture represented by interconnect conductors 18 are user programmable interconnect elements, one of which is shown with an exemplary reference numeral 26. The user programmable interconnect elements 26 are employed to selectively connect the analog circuits in the mask programmable portion 14 to the logic function modules 16-1 and 16-2 in the FPGA portion 12. Though not specifically illustrated, the user programmable interconnect elements 26 may either fully populate all of the intersections between interconnect conductors 24-1 through 24-6 and the interconnect conductors 18 or only a selected group of intersections.

In the mask programmable portion 14, five exemplary analog circuits 28-1 through 28-5 are shown. The analog circuits 28-1 through 28-5 are connected to I/O pads 30. The analog circuits 28-1 through 28-5 may be connected to I/O pads 30 through I/O buffers not shown which may provide any of the I/O functions known in FPGA technology. The analog circuits 28-1 though 28-5 illustrate some of the ways in which the analog circuits 28-1 through 28-5 may be connected to the interconnect architecture represented by interconnect conductors 18 of the FPGA portion 12. The connections between the mask programmable portion 14 and the FPGA portion 12 by interconnect conductors 24-1 through 24-6 are illustrative and not intended to be limiting. It should be appreciated that each of the analog circuits found in mask programmable portion 14 may be connected to the FPGA portion 12 as required by the particular analog circuits which are disposed in the mask programmable portion 14.

It should be appreciated, that in order to avoid overcomplicating the disclosure, similar elements in different figures are given the same reference numerals to avoid an over duplication of reference numerals, and to thereby avoid obscuring the present invention.

Figure 2A:
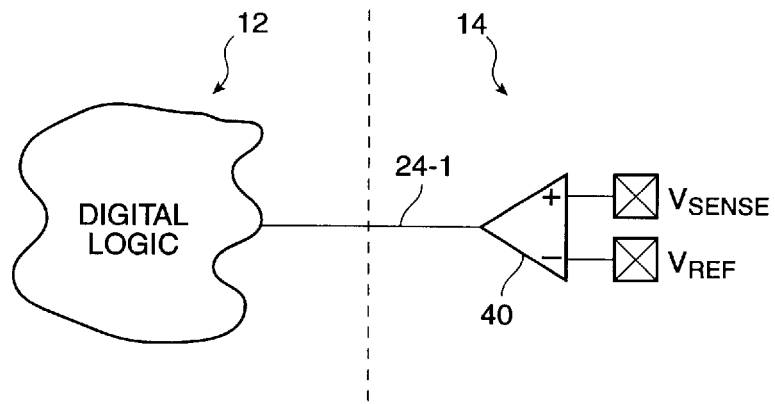
FIG. 2A is a block diagram of a comparator having analog input voltages and a digital output voltage and suitable for use in a mask programmable portion of a mixed signal integrated circuit according to the present invention.

Turning now to FIG. 2A, the analog circuit 28-1 is shown as a comparator 40. The inputs to the comparator 40 are first and second analog input voltages, namely, $V_{sense}$ and $V_{ref}$. The output of comparator 40 is a digital output that is supplied to the FPGA portion 12 of the integrated circuit 10 by interconnect conductor 24-1.

Figure 2B:
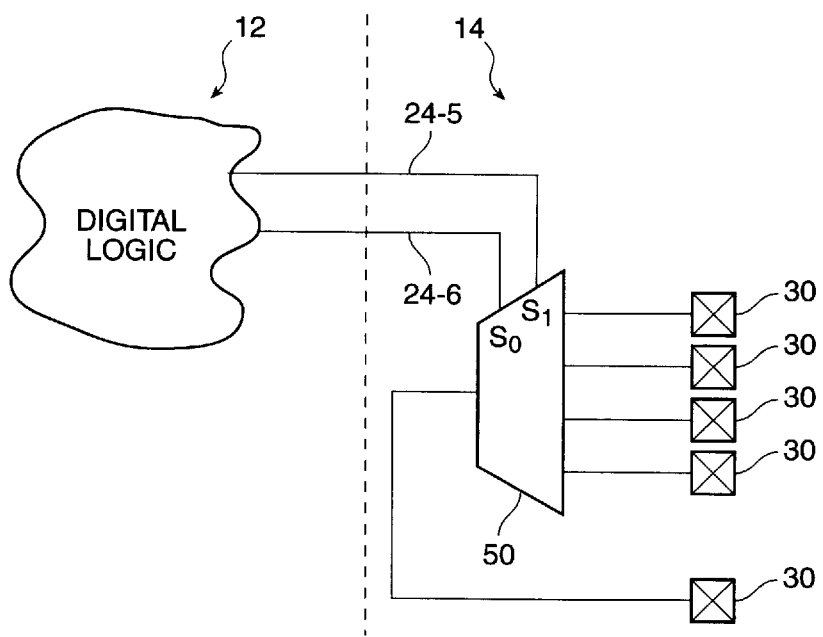
FIG. 2B is a block diagram of a multiplexer having a plurality of analog input voltages and digital select inputs and suitable for use in a mask programmable portion of a mixed signal integrated circuit according to the present invention.

In FIG. 2B, the analog circuit 28-5 is implemented as a multiplexer 50 having a plurality of four analog input voltages. First and second select signals, $S_0$ and $S_1$, are provided to the multiplexer 50 from the FPGA portion 12 by interconnect conductors 24-5 and 24-6. The output of multiplexer 50 is an analog signal that is output off of the integrated circuit 10.

Turning again to FIG. 1, analog circuits 28-2 and 28-3 are shown having their outputs connected to pass gates 32-1 and 32-2. The signals to either turn on or off pass gates 32-1 and 32-2 are provided on interconnect conductors 24-2 and 24-3 by the FPGA portion 12. The outputs of the pass gates 30-1 and 30-2 are connected together and then connected to an output pin. In this way either analog function 28-2 or 28-3 may be chosen by the FPGA portion 12 of the integrated circuit 10. The control by the FPGA portion 12, thereby permits field programmability of the analog circuits 28-2 and 28-3. It should be appreciated, although not shown in FIG. 1, that analog circuits 28-2 and 28-3 receive inputs either from the FPGA portion 12, other analog circuits in the mask programmable portion 14, or from source(s) external to integrated circuit 10.

Analog circuit 28-4 is illustrative of an analog circuit having either an input or output connected to the interconnect architecture of the FPGA portion 12 and either an input or output connected to an I/O pad 30. It should however also be appreciated that the inputs and outputs of analog circuit 28-4 may otherwise be obtained from and/or provided to other analog circuits in the masked programmable portion 14.

Figure 3A:
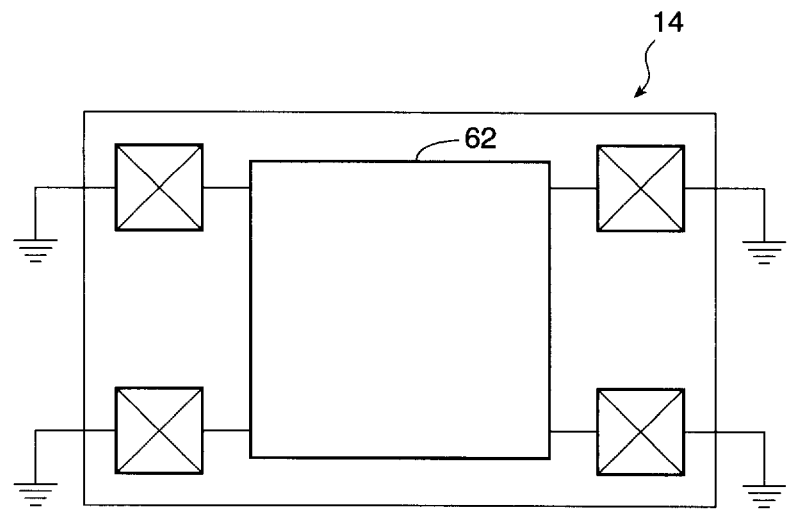
FIG. 3A illustrates a prior art FPGA wherein all of the input and output buffers to the FPGA share a common set of power buses.

One of the main concerns of analog circuit designers, is the presence of noise affecting the performance of the analog circuit. As illustrated by comparing FIGS. 3A and 3B, the analog circuits in the mask programmable portion 14 may be isolated from the FPGA portion 12 to substantially reduce the level of noise in the mixed signal system. As illustrated in the FPGA 60 of FIG. 3A, all of the input and output buffers to the FPGA 60 share a common set of power buses illustrated by a common ground bus 62.

Figure 3B:
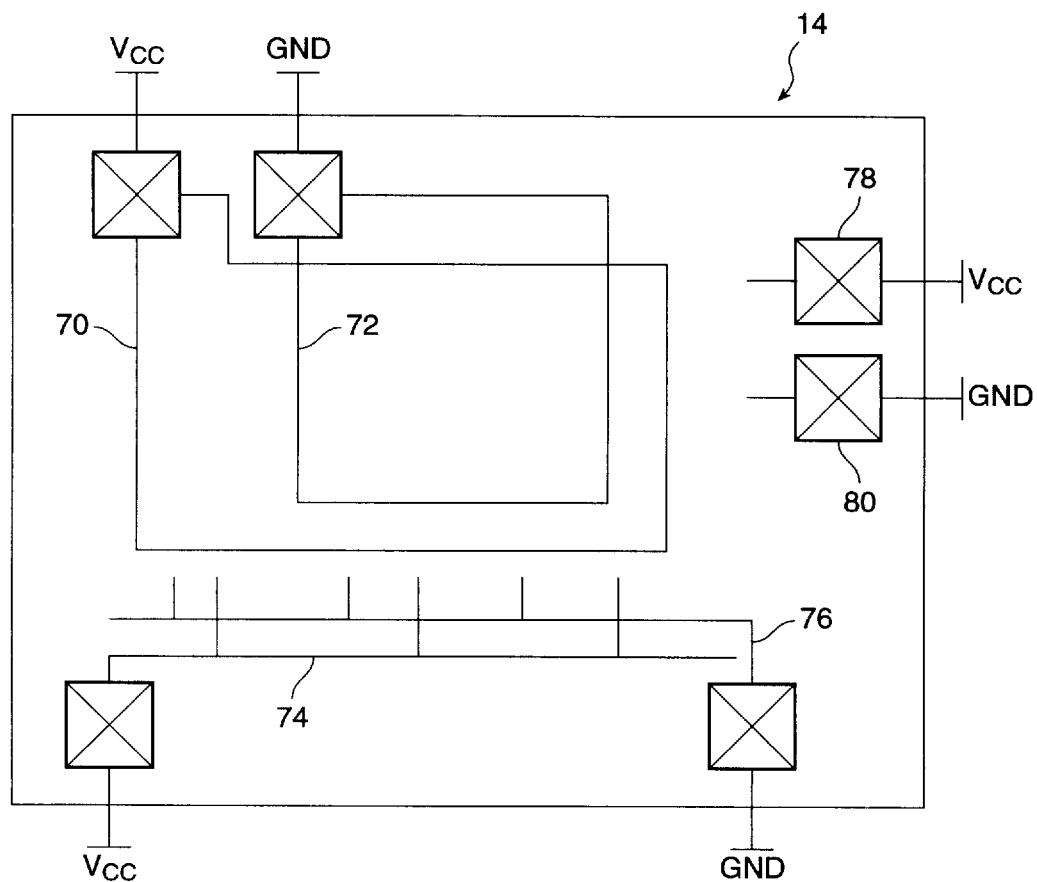
FIG. 3B illustrates separate power busses for an FPGA portion and a mask programmable portion of a mixed signal integrated circuit according to the present invention.

In contrast, as illustrated in FIG. 3B, the analog circuits in the mask programmable portion 14 can either be connected to shared Vcc and ground power busses 70 and 72 and/or be segregated to certain Vcc and ground power bus portions 74 and 76. Further, the mask programmed portion 14 can be used to substitute dedicated Vcc and ground power pads 78 and 80 for certain I/O locations, and thereby provide selected analog circuits separate busses to I/O pins.

For analog circuits which are extremely noise sensitive, the bus in the masked programmable portion can be tailored to be wider and thereby obtain lower ohmic voltage drops. In the case of an analog circuit which is implemented as a high power driver, the ability to implement selective busing offers distinct advantages in terms of reliability. For example, a high power driver may have a thicker busing structure to increase electromigration immunity. Finally, by separating the analog circuits not only from one another, but also from the FPGA portion 12, the analog circuits in the mask programmable portion 14 are not subjected to the noise generated by the digital circuits in the FPGA portion 12.

Figure 4:
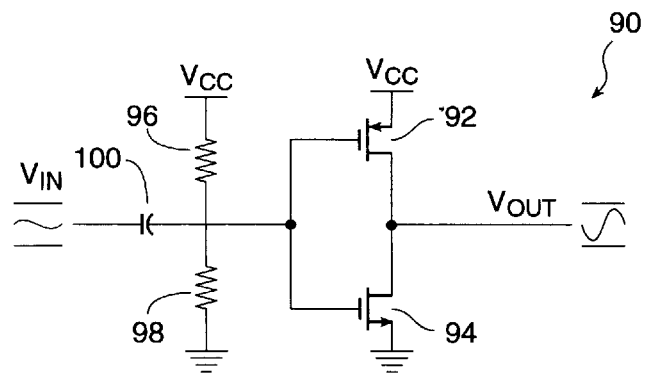
FIG. 4 illustrates a prior art standard CMOS inverter.

Turning now to FIG. 4, it will be appreciated that some analog functions may be implemented using standard CMOS topologies, and therefore are not difficult to implement with the logic modules 16-1 and 16-2 in the FPGA portion 12 in the integrated circuit 10. For example, a standard CMOS invertor 90 comprising a P-channel MOS transistor 92 as a pull up, and an N-channel MOS transistor 94 as a pull down, can serve as an inverting voltage amplifier with the addition of biasing resistors 96 and 98 and a capacitor 100 for blocking DC signals.

Figure 5:
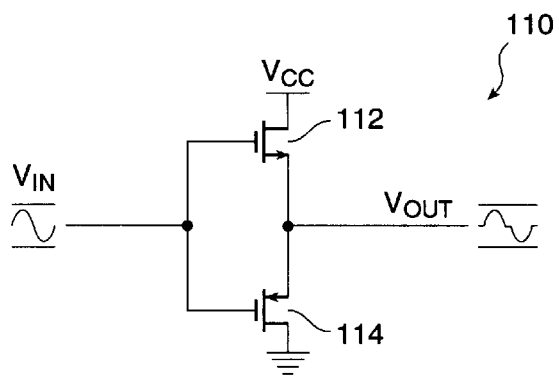
FIG. 5 illustrates a class B drive stage suitable for use in a mask programmable portion of a mixed signal integrated circuit according to the present invention.

However, there are many analog circuits which may not be easily implemented using standard CMOS topologies. A very simple example of this is shown in FIG. 5 which depicts a class B drive stage 110 wherein a N-channel MOS transistor 112 is employed in the pull up path, and a P-channel MOS transistor 114 is employed in the pull down path. Accordingly, one of the distinct advantages of the present invention is the ability to implement a wide variety of analog circuits having varying topologies.

Figure 6:
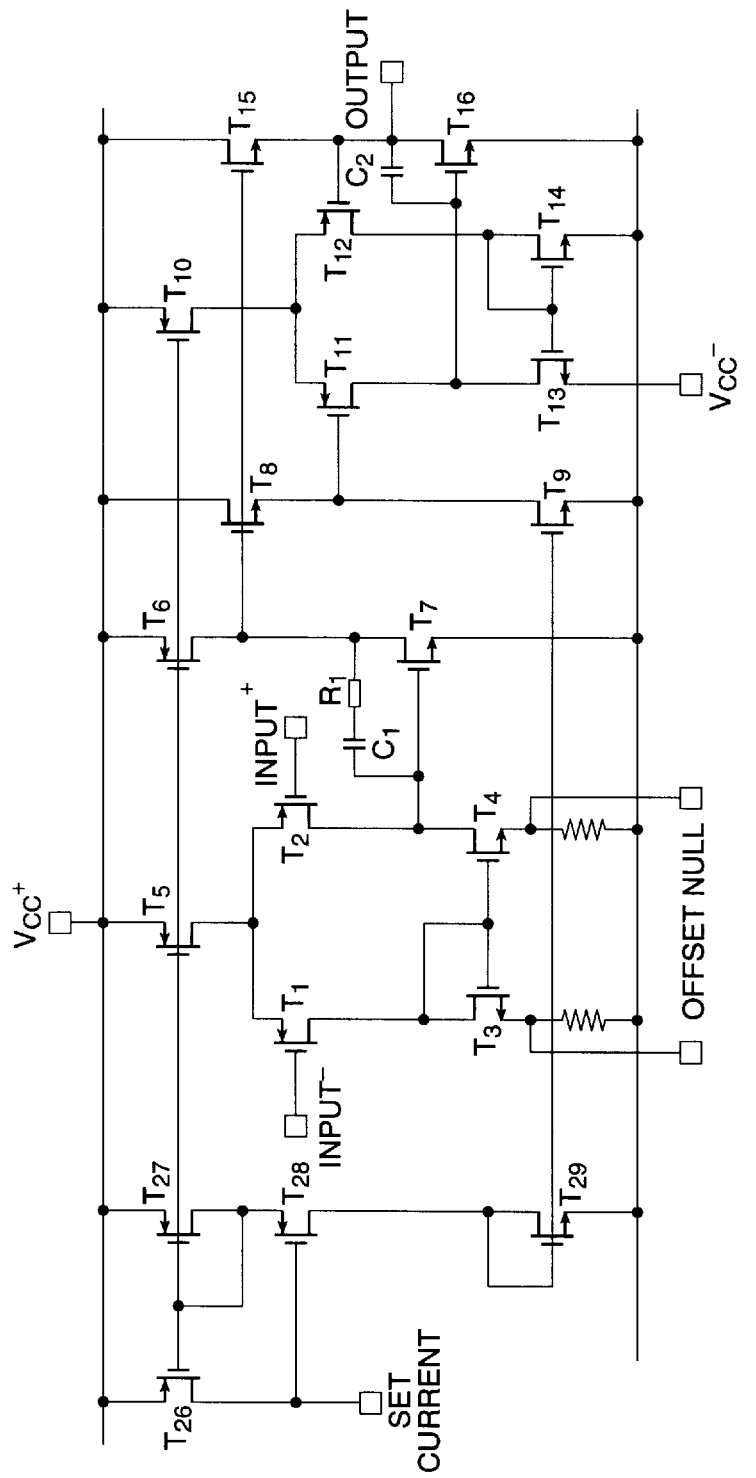
FIG. 6 illustrates a linear analog circuit op-amp suitable for use in a mask programmable portion of a mixed signal integrated circuit according to the present invention.

A first example out of the enormous number of analog circuits that may be implemented in the mask programmable portion 14 of the integrated circuit is illustrated in FIG. 6. The analog circuit shown in FIG. 6, though not described due to the fact that its implementation is well understood by those of ordinary skill in the art, is an op-amp. The op-amp depicted in FIG. 6 is known to those of ordinary skill in the art as a linear analog circuit. Further examples of linear analog circuits are comparator and timers, etc. It is important that linear analog circuits do not suffer from the resistance and capacitance which they would be subject to if they were implemented as either field programmable analog circuits, or if they were implemented using the logic function modules in an FPGA. The linear analog circuits would benefit from the noise immunity provided by the present invention. Finally, as explained above, the process desensitization of linear analog circuits would have a severe impact on the digital circuits in an FPGA.

Figure 7:
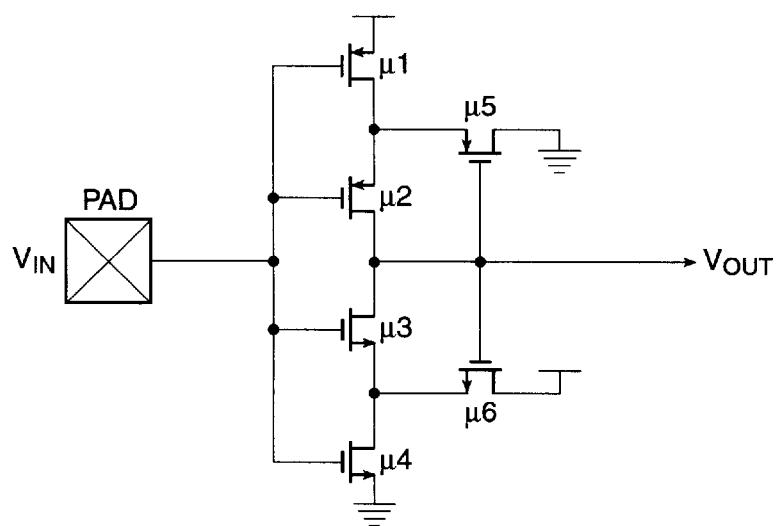
FIG. 7 illustrates a Schmitt trigger suitable for use in a mask programmable portion of a mixed signal integrated circuit according to the present invention.

A second example of an analog circuit that may be implemented in the mask programmable portion 14 of the integrated circuit is illustrated in FIG. 7. The analog circuit shown in FIG. 7, though not described due to the fact that its implementation is well understood by those of ordinary skill in the art, is a Schmitt trigger. Though the Schmitt trigger shown in FIG. 7 is a lower precision analog circuit, it may be better implemented in the mask programmable portion 14 of the integrated circuit 10 according to the present invention for reasons of both noise immunity and the problems of process desensitization.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A mixed signal integrated circuit architecture comprising:
   a mask programmable portion comprising:
     a plurality of mask programmed analog function circuits, each of said analog function circuits having at least one input and at least one output; and
     a first group of input/output pads, at least one of said input/output pads of said first group connected to an input of one of said analog function circuits; and
   a field programmable gate array portion comprising:
     a plurality of programmable digital logic function modules, each of said digital logic function modules having a plurality of inputs and at least one output;
     a second group of input/output pads;
     a plurality of interconnect conductors, each of said interconnect conductors divided into one or more segments, at least some first ones of said segments running in a first direction and at least some second ones of said segments running in a second direction different from said first direction to form intersections between said first ones and said second ones of said segments, said interconnect conductors forming intersections with said plurality of inputs and said at least one output of said digital logic function modules, said interconnect conductors forming intersections with said second group of input/output pads, said interconnect conductors forming intersections with said at least one output of one of said analog function circuits from said mask programmable analog portion; and
     a plurality of user programmable interconnect elements, first ones of said interconnect elements connected between adjoining ones of said segments in a same one of said interconnect conductors, second ones of said interconnect elements connected between intersections of selected ones said first and second segments, third ones of said interconnect elements connected between inputs and outputs of said digital logic function modules and selected interconnect conductors, fourth ones of said interconnect elements connected between intersections of said second group of input/output pads and selected ones of said interconnect conductors, fifth ones of said interconnect elements connected between intersections with said at least one output of one of said analog function circuits and selected ones of said interconnect conductors.

2. A mixed signal integrated circuit architecture comprising:
   a mask programmable portion comprising:
     a plurality of mask programmed analog function circuits, each of said analog function circuits having at least one input and at least one output; and
     a first group of input/output pads, at least one of said input/output pads of said first group connected to an output of one of said analog function circuits; and
   a field programmable gate array portion comprising:
     a plurality of programmable digital logic function modules, each of said digital logic function modules having a plurality of inputs and at least one output;
     a second group of input/output pads;
     a plurality of interconnect conductors, each of said interconnect conductors divided into one or more segments, at least some first ones of said segments running in a first direction and at least some second ones of said segments running in a second direction different from said first direction to form intersections between said first ones and said second ones of said segments, said interconnect conductors forming intersections with said plurality of inputs and said at least one output of said digital logic function modules, said interconnect conductors forming intersections with said second group of input/output pads, said interconnect conductors forming intersections with said at least one input of one of said analog function circuits from said mask programmable analog portion; and
     a plurality of user programmable interconnect elements, first ones of said interconnect elements connected between adjoining ones of said segments in a same one of said interconnect conductors, second ones of said interconnect elements connected between intersections of selected ones said first and second segments, third ones of said interconnect elements connected between inputs and outputs of said digital logic function modules and selected interconnect conductors, fourth ones of said interconnect elements connected between intersections of said second group of input/output pads and selected ones of said interconnect conductors, fifth ones of said interconnect elements connected between intersections with said at least one input of one of said analog function circuits and selected ones of said interconnect conductors.

3. A mixed signal integrated circuit architecture comprising:
   a mask programmable portion comprising:
     a plurality of mask programmed analog function circuits, each of said analog function circuits having at least one input and at least one output; and
     a first group of input/output pads, at least one of said input/output pads of said first group connected to an input of one of said analog function circuits, at least one of said input/output pads of said first group connected to an output of one of said analog function circuits; and a field programmable gate array portion comprising:

a plurality of programmable digital logic function modules, each of said digital logic function modules having a plurality of inputs and at least one output;

a second group of input/output pads;

a plurality of interconnect conductors, each of said interconnect conductors divided into one or more segments, at least some first ones of said segments running in a first direction and at least some second ones of said segments running in a second direction different from said first direction to form intersections between said first ones and said second ones of said segments, said interconnect conductors forming intersections with said plurality of inputs and said at least one output of said digital logic function modules, said interconnect conductors forming intersections with said second group of input/output pads, said interconnect conductors forming intersections with said at least one output of one of said analog function circuits from said mask programmable analog portion, said interconnect conductors forming intersections with said at least one input of one of said analog function circuits from said mask programmable analog portion; and a plurality of user programmable interconnect elements, first ones of said interconnect elements connected between adjoining ones of said segments in a same one of said interconnect conductors, second ones of said interconnect elements connected between intersections of selected ones said first and second segments, third ones of said interconnect elements connected between inputs and outputs of said digital logic function modules and selected interconnect conductors, fourth ones of said interconnect elements connected between intersections of said second group of input/output pads and selected ones of said interconnect conductors, fifth ones of said interconnect elements connected between intersections with said at least one output of one of said analog function circuits and selected ones of said interconnect conductors, sixth ones of said interconnect elements connected between intersections with said at least one input of one of said analog function circuits and selected ones of said interconnect conductors.

* * * * *